(12) United States Patent  (10) Patent No.: US 6,670,832 B1
Duong  (45) Date of Patent: Dec. 30, 2003

(54) GLITCH DETECT FILTER

(75) Inventor: Sonjia Duong, San Jose, CA (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 10/251,150

(22) Filed: Sep. 19, 2002

(51) Int. Cl.$^7$ .............................................. G01R 29/02
(52) U.S. Cl. ........................................ 327/34; 327/551
(58) Field of Search ........................... 327/34, 551, 552; 326/21

(56) References Cited

U.S. PATENT DOCUMENTS 5,087,828 A * 2/1992 Sato et al. ..................... 327/34
5,151,612 A * 9/1992 Ishikawa ....................... 327/34

* cited by examiner

Primary Examiner—Kenneth B. Wells
(74) Attorney, Agent, or Firm—Merchant & Gould P.C.; Timothy P. Sullivan

(57) ABSTRACT

A glitch detect filter system is described. The glitch detect filter system produces an output that is not susceptible to glitches. The glitch detect filter system provides a fixed output signal. The fixed output signal relates to the input signal loaded on the rising edge of signal Q1 or signal Q2 as determined by signal Q3. As the output signal is fixed, glitches in the input signal do not affect the output signal.

19 Claims, 3 Drawing Sheets

GLITCH DETECT FILTER

FIELD OF THE INVENTION

The present invention is related to electronic circuits, and more specifically to filter circuits.

BACKGROUND OF THE INVENTION

Many electronic circuits are subjected to noise, or "glitches" that may adversely affect their intended operation. For example, noise in the input can cause problems for the circuit.

The glitches can also cause the circuit to fail. These problems could possibly be catastrophic for the application in which the electronic circuit fails.

SUMMARY OF THE INVENTION

Briefly described, the present invention is directed at providing an apparatus and method that prevents glitches in the signal from interfering with the operation of the circuit.

According to one aspect of the invention, the apparatus consists of a glitch detect filter circuit that generates a fixed output signal that is unaffected by changes to the input signal for a predetermined period of time.

According to yet another aspect of the invention, the glitch detect filter system detects frequencies and pulse widths that are out of normal range.

According to yet another aspect of the invention, a method is provided to detect and filter out glitches that allow a circuit to operate normally during the glitch.

DETAILED DESCRIPTION OF THE PREFERRED EMBODIMENT

Figure 1:
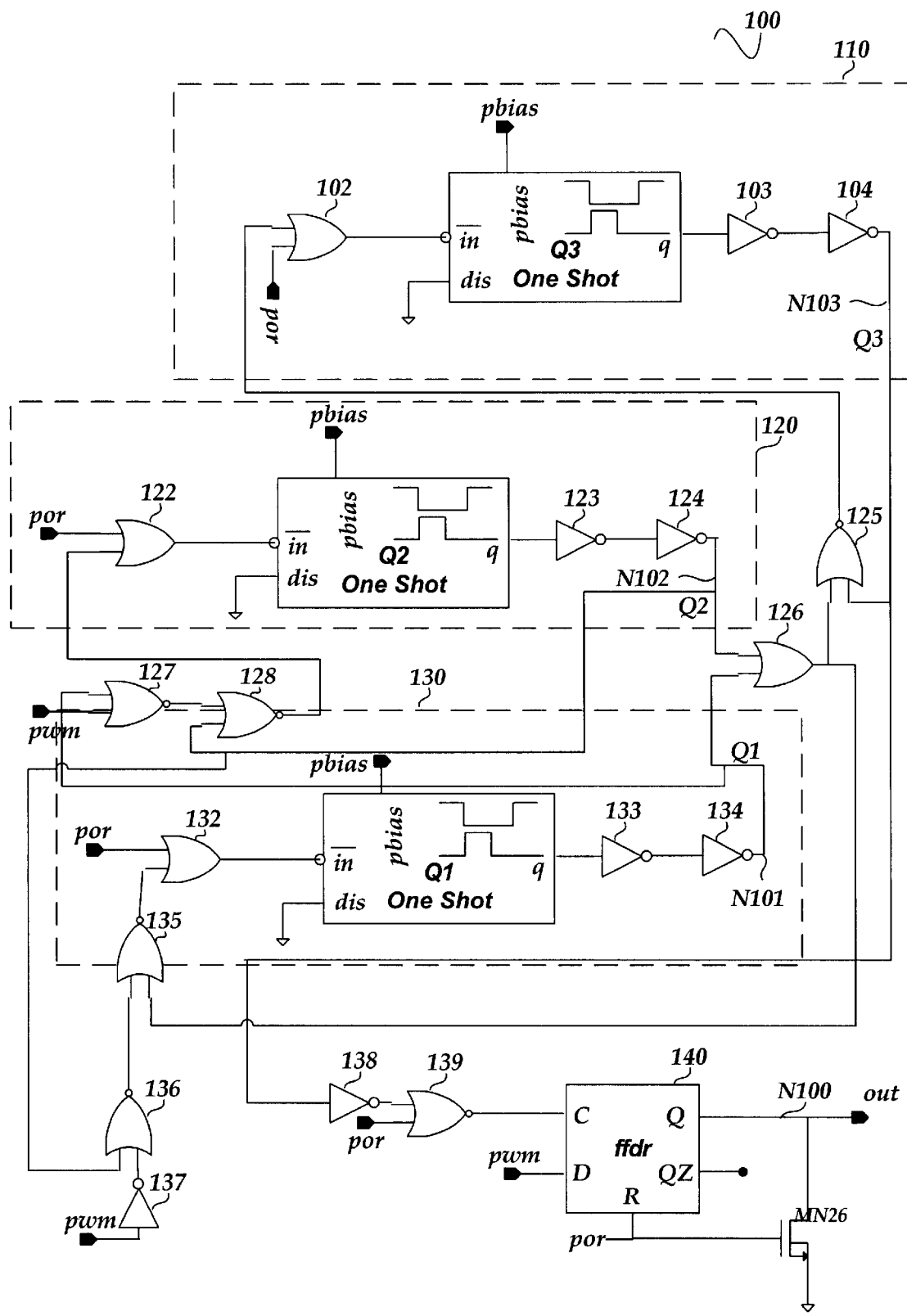
FIG. 1 illustrates a schematic diagram of a glitch detect filter system.

In the following detailed description of exemplary embodiments of the invention, reference is made to the accompanied drawings, which form a part hereof, and which is shown by way of illustration, specific exemplary embodiments of which the invention may be practiced. These embodiments are described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

Throughout the specification and claims, the following terms take the meanings explicitly associated herein, unless the context clearly dictates otherwise. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected, or an indirect connection through one or more passive or active intermediary devices. The term "circuit" means either a single component or a multiplicity of components, either active and/or passive, that are coupled together to provide a desired function. The term "signal" means at least one current, voltage, or data signal. The term "glitch" or "glitch event" means the incoming signal is out of a normal range associated with the circuit. Referring to the drawings, like numbers indicate like parts throughout the views.

Briefly described, the present invention is directed at providing an apparatus and method that maintains the normal operation of a circuit during a glitch event.

FIG. 1 illustrates an overview schematic diagram of a glitch detect filter circuit according to one embodiment of the invention. As shown in the figure, glitch detect circuit 100 includes Q1 circuit 110, Q2 circuit 120, Q3 circuit 130, Q1 one shot circuit, Q2 one shot circuit, Q3 one shot circuit, or gates 102, 122, 126, and 132, nor gates 125, 127, 128, 135, 136, and 139, invertors 103, 104, 123, 124, 133, 134, 137, and 138, and flip flop 140.

Briefly described glitch detect filter circuit 100 is arranged to produce an output that is not susceptible to glitches. The glitch detect filter circuit provides a fixed output signal at node 100. The fixed output signal corresponds to the input signal that is loaded on the rising edge of either Q1 or Q2. As the output signal is fixed for a period of time, glitches in the input signal do not affect the output signal.

Q1 one shot circuit, Q2 one shot circuit, and Q3 one shot circuit are configured to produce a one shot pulse of a predetermined length. According to one embodiment of the invention, Q1 and Q2 one shot circuits are configured to produce 115 ns pulses and Q3 one shot circuit is configured to generate a 20 ns pulse.

The POR signal is used to reset the circuit to a predetermined state. As long as the POR signal is a logical high ("1"), glitch detect filter circuit 100 does not look at the PWM input.

When the POR signal goes low, glitch detect filter circuit 100 looks at the PWM input signal. Q1 (N101) or Q2 (N102) goes high depending on the value of the input signal when the POR signal goes low.

When the PWM input signal is low, Q2 one shot goes high and produces a one shot pulse at node N102. According to one embodiment of the invention, Q2 goes high for 115 ns (See FIG. 2 for an exemplary representation of signal Q2). After the predetermined pulse time, Q2 goes low. When Q2 goes low, glitch detect filter circuit 100 looks at the PWM input signal again.

When the PWM input signal is high, Q1 at node N101 goes high, and produces a one shot pulse of a predetermined length. According to one embodiment of the invention, Q1 goes high for 115 ns (See FIG. 2 for an exemplary representation of signal Q1). After the predetermined time, Q1 goes low.

Q3 circuit 130 looks at the rising edges of Q1 and Q2. Every time there is a rising edge of Q1 or Q2, Q3 one shot generates a predetermined one shot pulse. According to one embodiment of the invention, this is a 20 ns pulse (See FIG. 2 for an exemplary representation of signal Q3). Q3 acts as a clock. When Q3 goes high, the PWM input signal is loaded into flip flop 140. The sampled input signal loaded into flip flop 140 is output to node N100.

As can be seen by the referring to the diagram, Q2 circuit 120 catches the input when it is low and Q1 circuit 110 catches the input when it is high.

Q1 one shot circuit and Q2 one shot circuit are not both on at the same time. The output of Q1 circuit 110 and Q2 circuit 120 are cross coupled. As soon as Q2 is on for the fixed pulse of 115 ns, Q2 circuit 120 provides feedback and blocks Q1 from going high. Similarly, when Q1 is high, Q1 circuit 110 generates feedback to Q2 circuit 120 through nor gate 127. It doesn't matter what happens to the PWM input during this time. The one shot pulses may be set to many different values. The timing is dependant upon the desired circuit characteristics.

Transistor MN26 helps to ensure that the output signal goes to a predetermined state when the circuit is powered off.

Figure 2:
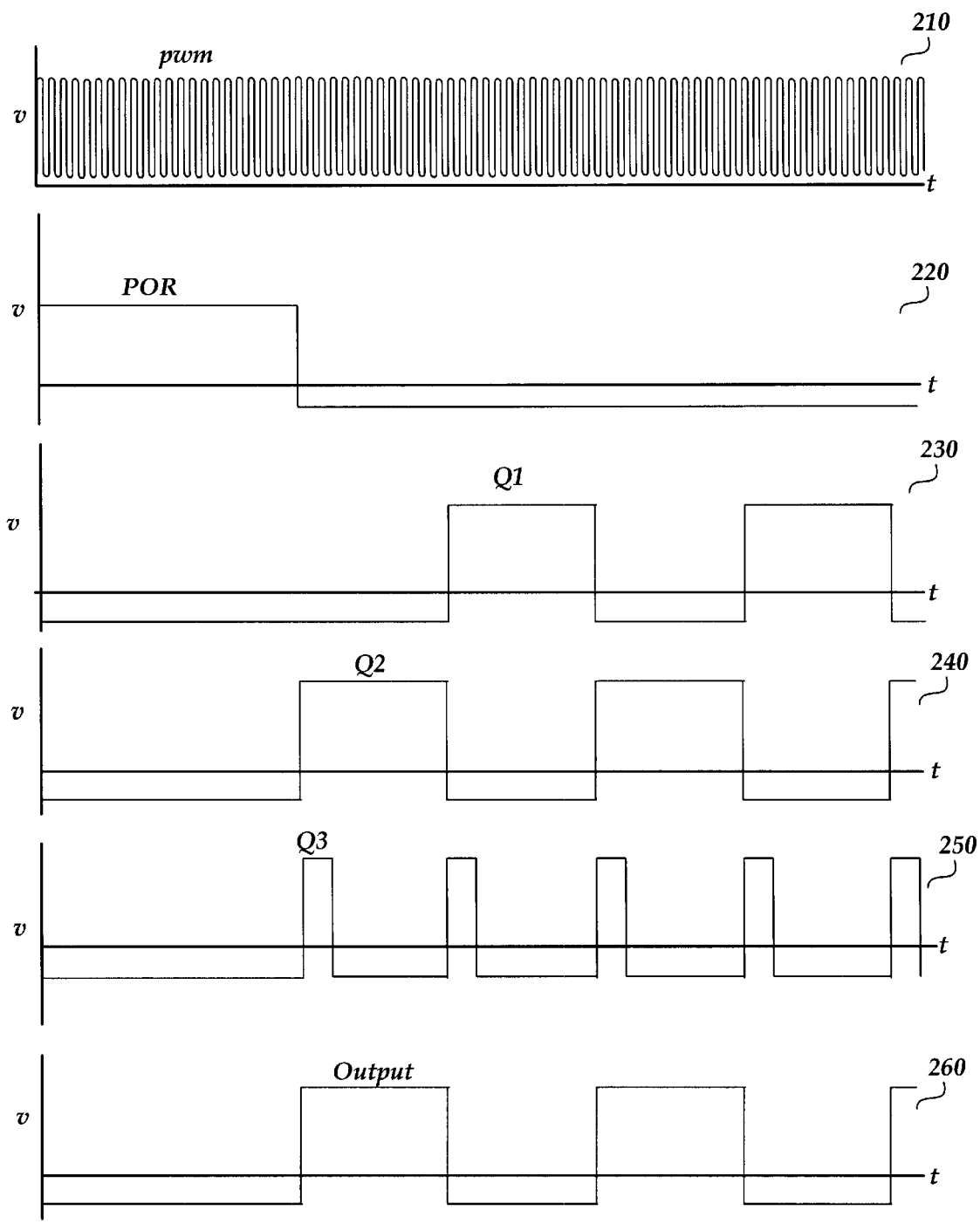
FIG. 2 shows timing diagrams illustrating aspects of the glitch detect filter system.

FIG. 2 shows timing diagrams illustrating aspects of the glitch detect filter system, according to one embodiment of the invention.

The input signal (pwm) to the glitch detect filter system is illustrated in block 210. As illustrated, the input signal (pwm) oscillates between a high and low value.

Block 220 illustrates a POR signal over time. As can be seen by referring to blocks 230–260, while the POR signal is high, signals Q1, Q2, Q3, and Output are low.

The first rising edge shown in block 230 illustrates the situation when POR is low and PWM is high. When this situation occurs a fixed Q1 pulse is generated. Whenever Q1 is high, Q2 is low.

The first rising edge shown in block 240 illustrates the situation when POR goes low and PWM is low. When this situation occurs a fixed Q2 pulse is generated. Whenever Q2 is high, Q1 is low.

The first rising edge shown in block 250 illustrates the situation when a rising edge was detected in Q1 or Q2. When a rising edge is detected a fixed Q3 pulse is generated.

Block 260 illustrates the output signal generated by the glitch detect filter system. As can be seen, the output is not affected by glitches within the input signal.

Figure 3:
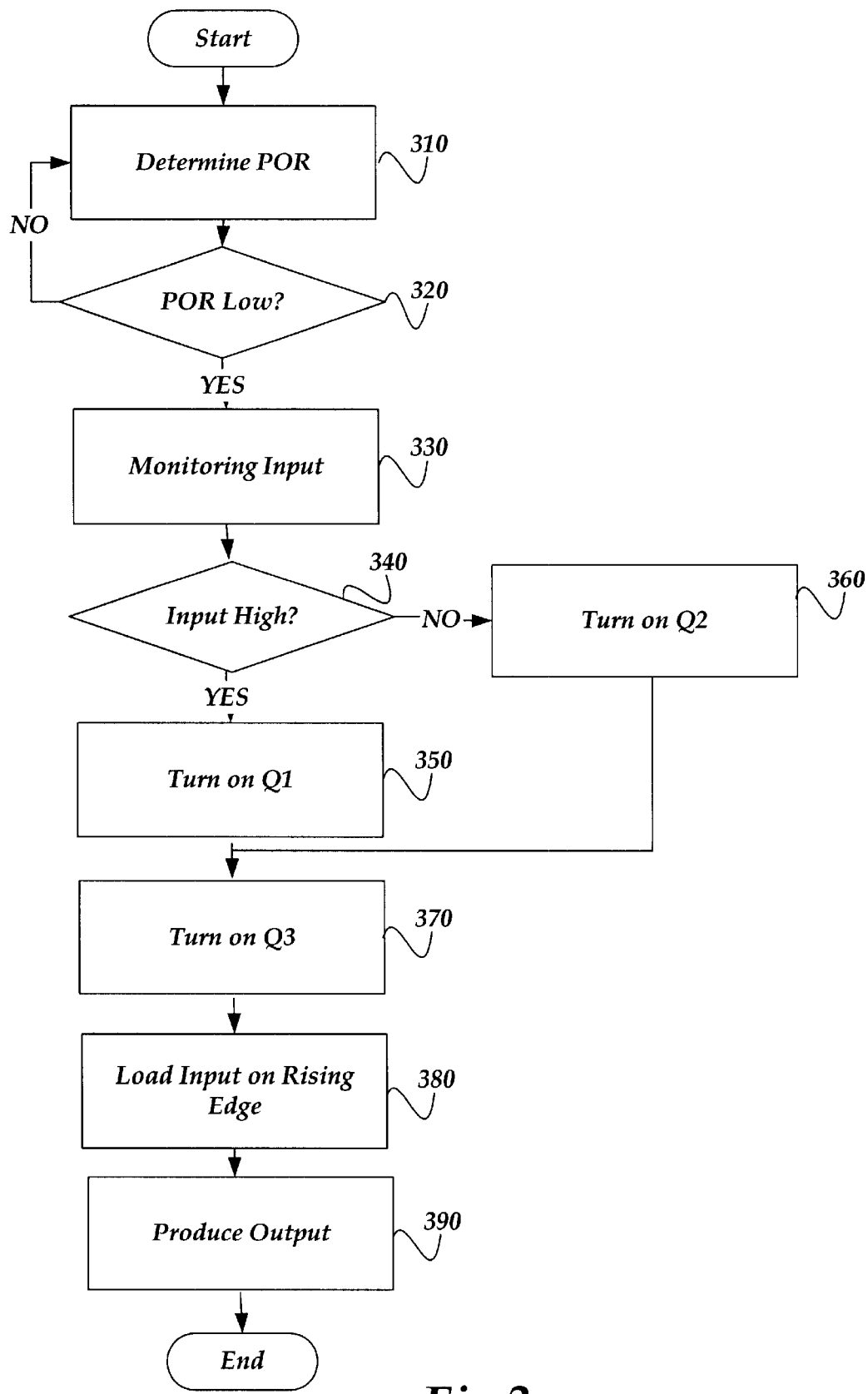
FIG. 3 illustrates a process diagram of the operation a glitch detect filter system, in accordance with aspects of the invention.

FIG. 3 shows a logical flow diagram of operation of a glitch detect filter system 300, according to aspects of the invention.

After a start block, the logic flows to a block 310 at which point the POR level is determined. The POR signal is used to reset the circuit. According to one embodiment of the invention, when the POR signal is a logical high ("1") the circuit is reset. When the POR signal is a logical low ("0") the glitch detect filter circuit operates normally.

Moving to decision block 320 a determination is made as to whether the POR signal is low. When the POR signal is not low, the process returns to block 310.

When the POR signal is low, the process moves to block 330 where the input is determined.

Transitioning to decision block 340, a determination is made as to whether the input signal is high. When the input signal is high, the process moves to block 350 and Q1 is turned on. When Q1 is turned on, a pulse of a predetermined length is generated. According to one embodiment of the invention, the pulse length for Q1 is 115 ns.

When the input is low, the process moves to block 360 and Q2 is turned on. When Q2 is turned on, a pulse of a predetermined length is generated. According to one embodiment of the invention, the pulse length for Q2 is 115 ns.

Flowing to block 370, Q3 is turned on. When Q3 is turned on, a pulse of a predetermined length is generated. According to one embodiment of the invention, the pulse length for Q3 is 20 ns. Q3 acts as a clock.

Moving to block 380, the input is loaded on the rising edge of Q3. Transitioning to block 390, the output is produced based on the loaded PWM input. The process flows to an end block and returns to processing other actions.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. An apparatus for preventing a glitch in an input signal from affecting an output signal, comprising:

a first one shot pulse circuit arranged to receive the input signal and a second feedback signal and output a first pulse signal (Q1) in response to the input signal and the second feedback signal;

a second one shot pulse circuit arranged to receive the input signal and a first feedback signal and output a second pulse signal (Q2) in response to the input signal and the first feedback signal;

a third one shot pulse circuit coupled to the first one shot pulse circuit and coupled to the second one shot pulse circuit and arranged to output a third pulse signal (Q3) in response to signals Q1 and Q2; and a memory circuit coupled to the third one shot pulse circuit and arranged to receive the input signal and signal Q3, wherein the memory circuit is configured to load the input signal in response to signal Q3, and output an output signal relating to the loaded input signal.

2. The apparatus of claim 1, wherein signals Q1, Q2, and Q3 are pulses of a predetermined length.

3. The apparatus of claim 2, wherein the first feedback signal is signal Q1 and the second feedback signal is signal Q2.

4. The apparatus of claim 2, wherein the third one shot pulse circuit is arranged to output signal Q3 on a rising edge of signal Q1 and on a rising edge of signal Q2.

5. The apparatus of claim 2, wherein the memory circuit is a flip flop circuit.

6. The apparatus of claim 2, wherein the input signal is loaded in response to a positive value of Q3.

7. The apparatus of claim 2, wherein the first one shot pulse circuit is further configured to receive the first feedback signal.

8. The apparatus of claim 2, wherein the second one shot pulse circuit is further configured to receive the second feedback signal.

9. The apparatus of claim 2, wherein the third one shot pulse circuit is further configured to receive a third feedback signal.

10. The apparatus of claim 9, wherein the third feedback signal is signal Q3.

11. The apparatus of claim 2, further comprising a transistor circuit configured to place the output signal in a predetermined state when the apparatus is powered down.

12. A method for rejecting glitches from interfering with the operation a circuit, comprising:

receiving an input signal;

monitoring the input signal;

determining when the input signal is high and low;

generating a first pulse when the input signal is high;

generating a second pulse when the input signal is low; and generating an output signal based on the input signal in response to the generation of the fist pulse and the generation of the second pulse.

13. The method of claim 12, wherein generating the output further comprises loading the input signal into a memory circuit.

14. The method of claim 13, further comprising monitoring the first pulse, monitoring the second pulse, and in response to the monitoring, producing a third pulse, wherein the third pulse is used in generating the output signal.

15. The method of claim 14, wherein monitoring the first pulse and monitoring the second pulse further comprises determining when a rising edge occurs on the first pulse and when a rising edge occurs on the second pulse.

16. The method of claim 13, wherein generating the first pulse further comprises generating the first pulse for a predetermined time.

17. The method of claim 13, wherein generating the second pulse further comprises generating the first pulse for a predetermined time.

18. The method of claim 12, further comprising monitoring a POR signal; and in response to the monitoring determining when to generate the first pulse and the second pulse.

19. An apparatus for preventing a glitch in an input signal from affecting an output signal, comprising:
- a means for receiving an input signal;
- a means for monitoring the input signal;
- a means for determining when the input signal is high and low;
- a means for generating a first pulse when the input signal is high;
- a means for generating a second pulse when the input signal is low; and
- a means for generating an output signal based on the input signal in response to the generation of the first pulse and the generation of the second pulse.

* * * * *